United States Patent [19]
Antle et al.

[11] Patent Number: 5,914,501
[45] Date of Patent: Jun. 22, 1999

[54] LIGHT EMITTING DIODE ASSEMBLY HAVING INTEGRATED ELECTROSTATIC DISCHARGE PROTECTION

[75] Inventors: William K. Antle, Sunnyvale; Michael K. Lam; James W. Stewart, both of San Jose, all of Calif.

[73] Assignee: Hewlett-Packard Company, Palo Alto, Calif.

[21] Appl. No.: 09/141,389

[22] Filed: Aug. 27, 1998

[51] Int. Cl.⁶ .......................... H01L 33/00; H01L 27/15; H01L 31/12
[52] U.S. Cl. ................................... 257/99; 257/79; 257/84
[58] Field of Search .................................. 257/79, 84, 99

[56] References Cited

U.S. PATENT DOCUMENTS 3,855,606  12/1974  Schoberl .
5,324,962  6/1994  Komoto et al. ............................ 257/89
5,347,147  9/1994  Jones ......................................... 257/77

*Primary Examiner*—Ngân V. Ngô
*Attorney, Agent, or Firm*—John L. Imperato

[57] ABSTRACT

A light-emitting diode assembly incorporates a power shunting element that provides electrical over-stress protection to a light-emitting diode (LED) and prevents damage to the LED from electrostatic discharge (ESD). The power shunting element is coupled in parallel to the LED within the LED assembly and protects the LED by diverting electrical current from the LED and limiting the voltage across the LED to a clamp voltage when a threshold voltage across the LED is exceeded.

12 Claims, 3 Drawing Sheets

LIGHT EMITTING DIODE ASSEMBLY HAVING INTEGRATED ELECTROSTATIC DISCHARGE PROTECTION

BACKGROUND OF THE INVENTION

Due to their compact size, high reliability and low power consumption light-emitting diodes (LEDs) have replaced incandescent bulbs in a variety of optical signaling systems such as automotive tail lights and traffic signals. However, presently available LEDs are susceptible to damage from electrostatic discharge (ESD) which may degrade performance and reduce the reliability of the signaling systems in which the LEDs are used. In an attempt to protect the LEDs from ESD damage, special handling precautions are taken during assembly of the optical signaling systems. These handling precautions increase the manufacturing cost of the system because they involve grounding of equipment such as workbenches, flooring, assembly fixtures and tools and also persons handling the LEDs. In addition, the handling precautions are not completely effective at preventing build-up of electrostatic potential which causes ESD that damages the LEDs.

SUMMARY OF THE INVENTION

According to the preferred embodiments of the present invention, a light-emitting diode assembly incorporates a power shunting element that provides electrical over-stress protection to an LED and prevents damage to the LED from electrostatic discharge (ESD). The power shunting element is coupled in parallel to the LED within the LED assembly and protects the LED by diverting electrical current from the LED and limiting the voltage across the LED to a clamp voltage when a threshold voltage across the LED is exceeded.

DETAILED DESCRIPTION OF THE PREFERRED EMBODIMENT

Figure 1:
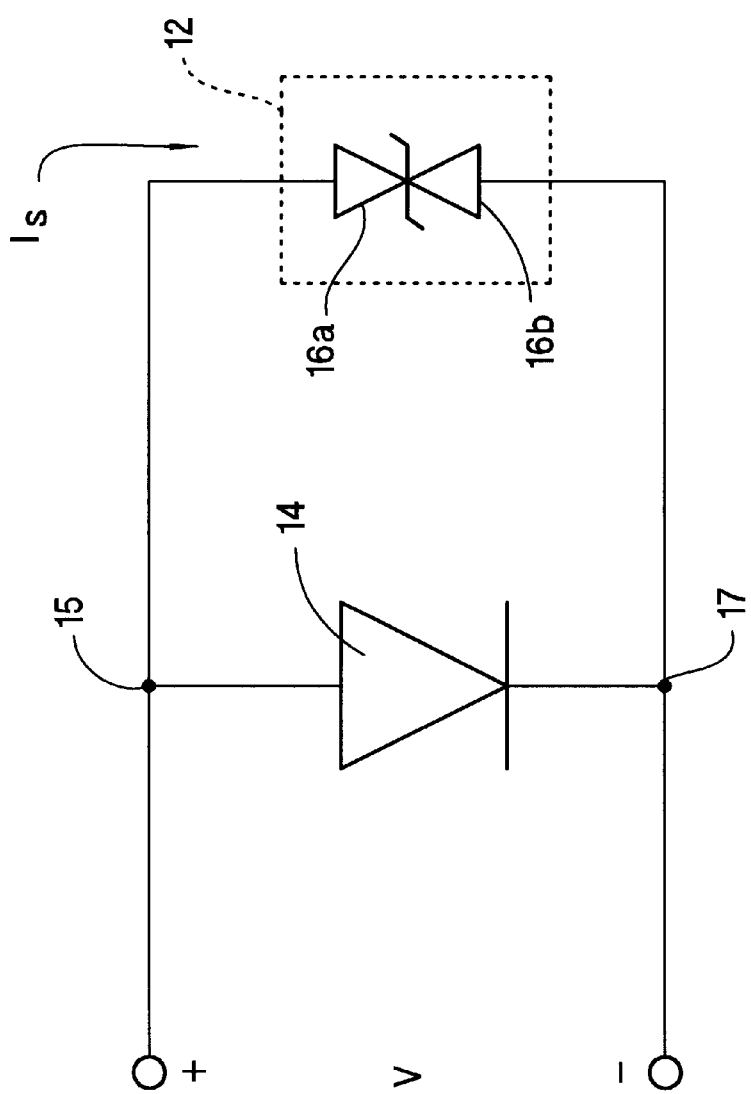
FIG. 1 shows a schematic of a light-emitting diode assembly including a power shunting element constructed according to the preferred embodiments of the present invention.

FIG. 1 shows a schematic of a light-emitting diode assembly 10 including a power shunting element 12 constructed according to the preferred embodiment of the present invention.

The power shunting element 12 is connected in parallel with a light-emitting diode (LED) 14, between a first electrical contact 15 and a second electrical contact 17 of the LED 14. When a voltage V applied between the electrical contacts exceeds a threshold voltage, power dissipation within the LED 14 is limited by the power shunting device 12 which clamps the voltage V to a clamp voltage and diverts a current $I_s$ from the LED 14. Thus, the power shunting element 12 provides protection for the LED 14 against electrical over-stress, such as that produced by electrostatic discharge (ESD) that is damaging to LEDs in the absence of the power shunting element 12.

The power shunting element 12 is implemented using a variety of voltage clamping devices such as a back-to-back configuration of diodes 16a, 16b. When the voltage clamping devices are Zener diodes, the threshold voltage and the clamp voltage are determined by the Zener voltage of the one of the Zener diodes that is reverse biased and the forward turn-on voltage of the one of the Zener diodes that is forward biased. As an alternative example, when the back-to-back diodes 16a, 16b are transient voltage suppressor (TVS) diodes, the threshold voltage and clamp voltage are determined by the reverse stand-off voltage of the TVS diodes.

The threshold voltage of the power shunting element 12 is chosen to be at least as great as the peak operating voltage of the LED 14 to be protected. For example, the threshold voltage is chosen to be at least as great as the forward junction voltage of the LED 14 to allow proper operation of the LED. The clamp voltage is chosen to be sufficiently small to limit power dissipation within the LED 14, assuring reliability of the LED even when the applied voltage V exceeds the forward junction voltage of the LED 14.

Figure 2:
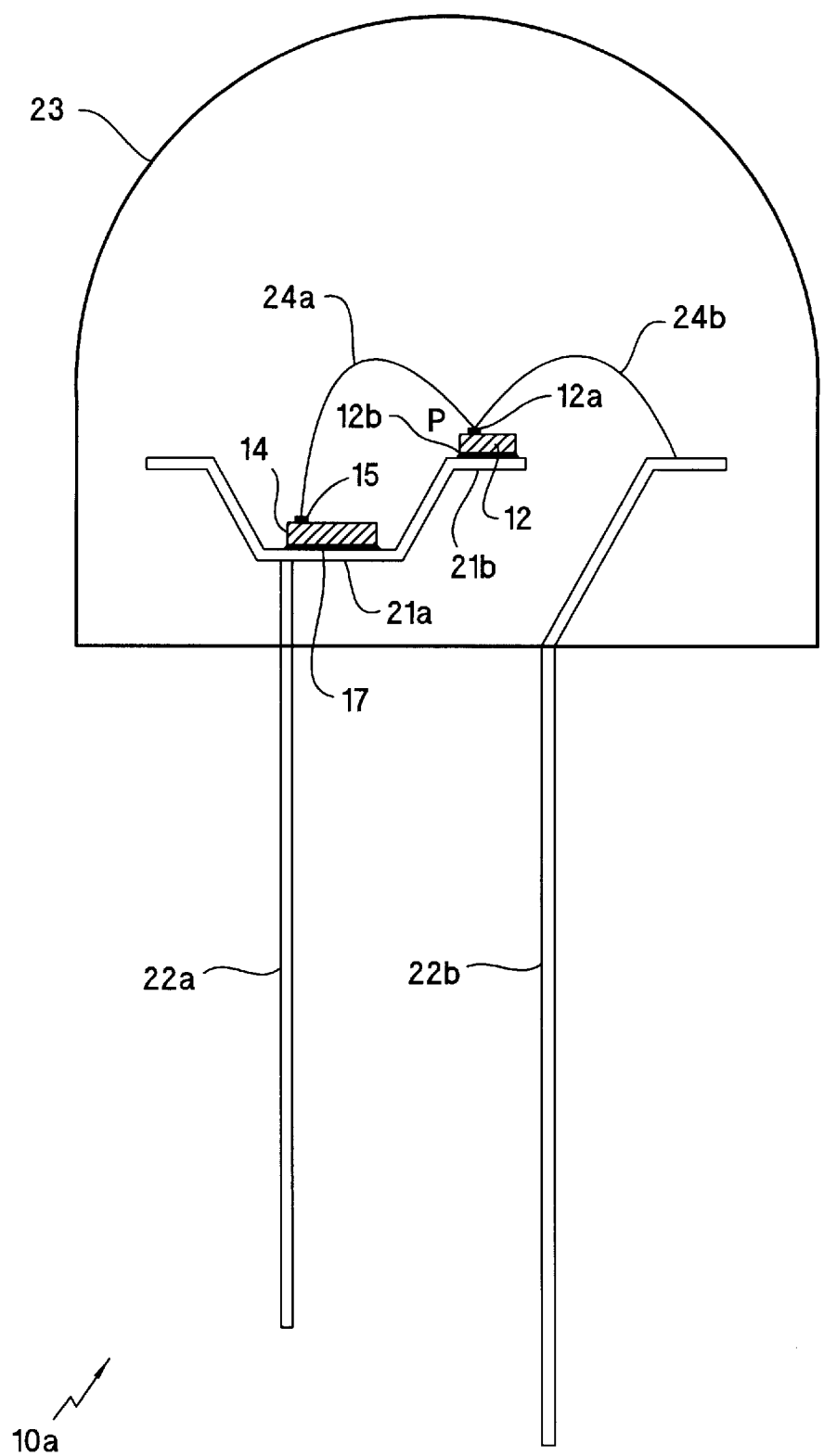
FIG. 2 shows a cross-section of the light-emitting diode assembly constructed according to a first preferred embodiment of the present invention.
Figure 3:
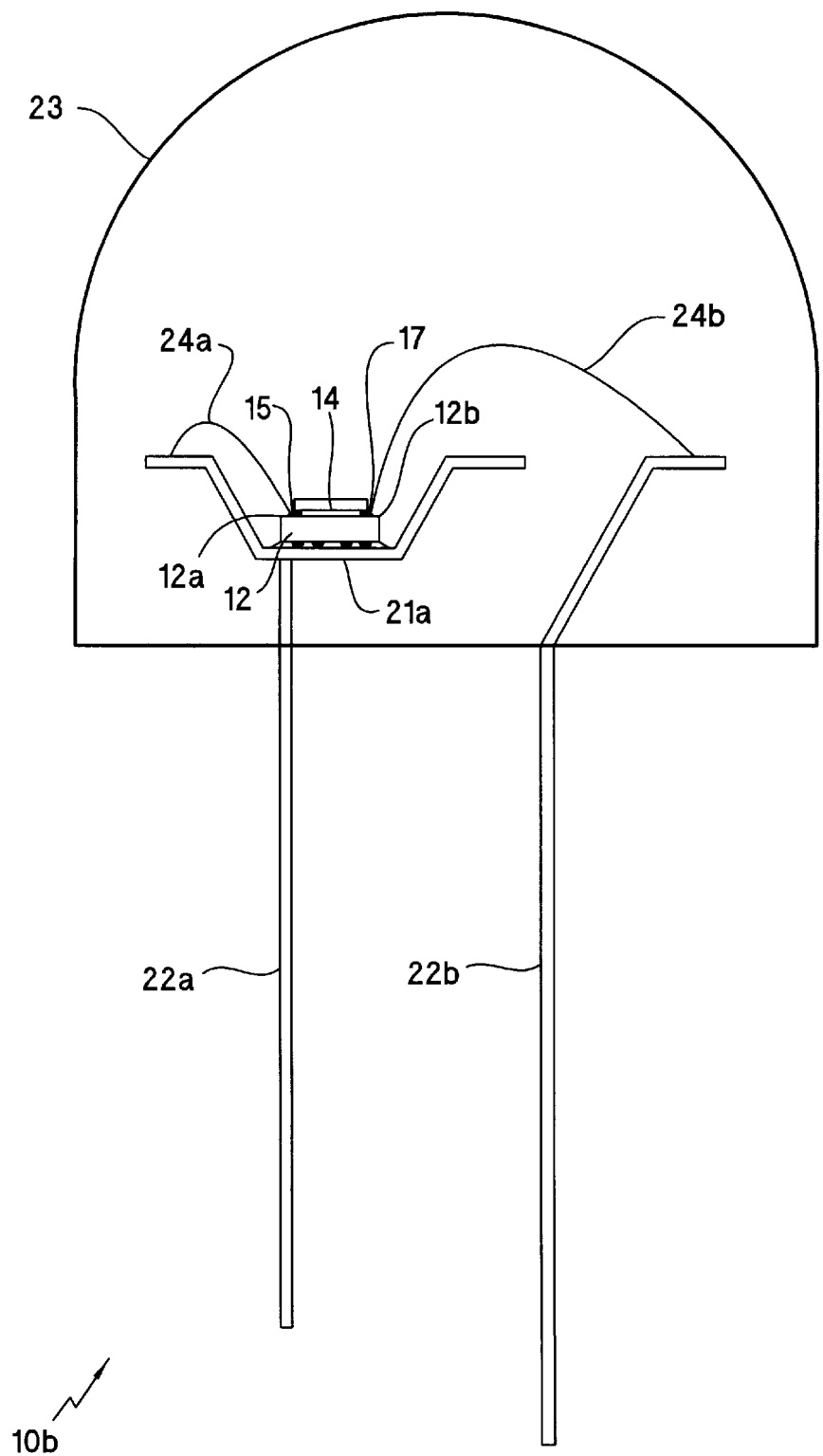
FIG. 3 shows a cross-section of the light-emitting diode assembly constructed according to a second preferred embodiment of the present invention.

FIG. 2 shows a cross-section of a light-emitting diode assembly 10a constructed according to a first preferred embodiment of the present invention. The LED 14 is attached to a first mounting site 21a of a first electrode 22a protruding from a package 23 of the LED assembly 10a using epoxy, solder or other attaching means. The power shunting element 12 is attached to a second mounting site 21b of the first electrode 22a. A pair of wire bonds 24a, 24b, mesh bonds, welds or other connection means provides electrical conduction between the first electrical contact 15 of the LED 14, the first terminal 12a of the power shunting element 12 and a second electrode 22b. Electrical conduction between a second electrical contact 17 of the LED 14 and a second terminal 12b of the power shunting element 12 is provided through the first electrode 22a. The power shunting element 12 limits the voltage V between the first electrical contact 15 and second electrical contact 17 of the LED 14 to the clamp voltage and diverts current Is from the LED 14 when the applied voltage V exceeds the threshold voltage. FIG. 3 shows a cross-section of a light-emitting diode assembly 10b constructed according to a second preferred embodiment of the present invention. In the second preferred embodiment the power shunting element 12 is mounted on a mounting site 21a of a first electrode 22a protruding from a package 23 of the LED assembly lob. An LED 14 is attached to a top surface of the power shunting element 12 using flip-chip soldering so that a first electrical contact 15 of the LED 14 is electrically connected to a first terminal 12a of the power shunting element 12 and a second electrical contact 17 of the LED 14 is electrically connected to a second terminal 12b of the power shunting element 12. The first electrical contact 15 and the first terminal 12a are coupled to the first electrode 22a using a wire bond 24a or other type of connection. The second electrical contact 17 and the second terminal 12b are coupled to the second electrode 22b using a wire bond 24b or other type of connection. The power shunting element 12 limits the voltage V between the first electrical contact 15 and second electrical contact 17 of the LED 14 to the clamp voltage and diverts current $I_s$ from the LED when the applied voltage V exceeds the threshold voltage.

While the preferred embodiments of the present invention have been illustrated in detail, it should be apparent that modifications and adaptations to these embodiments may occur to one skilled in the art without departing from the scope of the present invention as set forth in the following claims.

What is claimed is:

1. A light-emitting diode assembly, comprising:

a light-emitting diode having a first electrical contact and a second electrical contact;

a package having a first electrode coupled to the first electrical contact and a second electrode coupled to the second electrical contact, the first electrode and the second electrode for receiving an applied voltage;

a power shunting element coupled to the first electrical contact and the second electrical contact, shunting electrical current from the light-emitting diode when the applied voltage exceeds a threshold voltage.

2. The light-emitting diode assembly of claim 1 wherein the power shunting element includes a back-to-back configuration of voltage clamping devices.

3. The light-emitting diode assembly of claim 2 wherein the back-to-back configuration of voltage clamping devices includes at least one zener diode.

4. The light-emitting diode assembly of claim 2 wherein the back-to-back configuration of voltage clamping devices includes at least one transient voltage suppressor.

5. The light-emitting diode assembly of claim 1 wherein the first electrode has a first mounting site accommodating the light-emitting diode and a second mounting site for accommodating the power shunt element, the coupling between the second electrical contact and the power shunting element provided by the first electrode.

6. The light-emitting diode assembly of claim 5 wherein the power shunting element includes a back-to-back configuration of voltage clamping devices.

7. The light-emitting diode assembly of claim 6 wherein the back-to-back configuration of voltage clamping devices includes at least one zener diode.

8. The light-emitting diode assembly of claim 6 wherein the back-to-back configuration of voltage clamping devices includes at least one transient voltage suppressor.

9. The light-emitting diode assembly of claim 1 wherein the power shunting element has a bottom surface attached to the first electrode and a top surface having a first terminal and a second terminal, the first electrical contact of the light-emitting diode coupled to the first terminal and the second electrical contact of the light-emitting diode coupled to the second terminal using flip-chip soldering.

10. The light-emitting diode assembly of claim 9 wherein the power shunting element includes a back-to-back configuration of voltage clamping devices.

11. The light-emitting diode assembly of claim 10 wherein the back-to-back configuration of voltage clamping devices includes at least one zener diode.

12. The light-emitting diode assembly of claim 10 wherein the back-to-back configuration of voltage clamping devices includes at least one transient voltage suppressor.

* * * * *